US010090040B1

(12) United States Patent
Chun et al.

(10) Patent No.: US 10,090,040 B1
(45) Date of Patent: Oct. 2, 2018

(54) SYSTEMS AND METHODS FOR REDUCING MEMORY POWER CONSUMPTION VIA PRE-FILLED DRAM VALUES

(71) Applicant: QUALCOMM INCORPORATED, San Diego, CA (US)

(72) Inventors: Dexter Chun, San Diego, CA (US); Yanru Li, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 1 day.

(21) Appl. No.: 15/472,622

(22) Filed: Mar. 29, 2017

(51) Int. Cl.
*G11C 7/00* (2006.01)
*G11C 11/4091* (2006.01)
*G11C 11/4093* (2006.01)
*G11C 11/4096* (2006.01)

(52) U.S. Cl.
CPC ...... *G11C 11/4091* (2013.01); *G11C 11/4093* (2013.01); *G11C 11/4096* (2013.01)

(58) Field of Classification Search
CPC .................................................. G11C 11/4096
USPC .................................................... 365/189.16
See application file for complete search history.

(56) References Cited

U.S. PATENT DOCUMENTS 5,896,331 A * 4/1999 Crafts .................... G11C 29/28 365/201
6,393,587 B2 * 5/2002 Bucher .................. H04L 43/18 714/39
6,785,190 B1 8/2004 Bains et al.
7,464,243 B2 12/2008 Haridas et al.
9,092,358 B2 7/2015 Rychlik et al.
9,110,809 B2 * 8/2015 Holmqvist .......... G06F 12/0886
2017/0076768 A1 3/2018 Jon-Pil et al.

FOREIGN PATENT DOCUMENTS

EP 0446847 9/1991

OTHER PUBLICATIONS www.ece.cmu.edu, "RowClone: Fast and Efficient In-DRAM Copy and Initialization of Bulk Data," By Vivek Seshadri et al., Apr. 25, 2013 pp. No. 01-26.
http://www.kalytta.com, "Memory Controller: Page Operations," by Benjamin Kalytta, Nov. 2008 pp. No. 01-08; Revision: 0.4.
Internation Search Report and Written Opinion for PCT App no. PCT/US2018/016519, dated May 9, 2018; 171 pages.

* cited by examiner

*Primary Examiner* — Son Mai
(74) *Attorney, Agent, or Firm* — Smith Tempel Blaha LLC

(57) ABSTRACT

Systems and methods are disclosed for reducing memory power consumption via pre-filled dynamic random access memory (DRAM) values. One embodiment is a method for providing DRAM values. A fill request is received from an executing program to fill an allocated portion of the DRAM with a predetermined pattern of values. The predetermined pattern of values is stored in a fill value memory residing in the DRAM. A fill command is sent to the DRAM. In response to the fill command, a plurality of sense amp latches are connected to the fill value memory to update the corresponding sense amp latch bits with the predetermined pattern of values stored in the fill value memory.

30 Claims, 10 Drawing Sheets

100

SoC 102
O/S 130
CPU 106
PROGRAM(S) 105
DDR FILL DRIVER 107
SRAM 108
ROM 110
SoC BUS
116
DRAM CONTROLLER 112
STORAGE MEMORY CTLR 114
STORAGE MEMORY 118
ADDR/CTL 122
DATA 124
DRAM 104
PHY 120
DECODE & CONTROL 126
FILL I/O 128
FILL VALUE MEMORY 130
SET/CLR I/O 132
SENSE AMP LATCHES 134
GLOBAL I/O 136
ARRAY I/O 138
DRAM CELL ARRAY 140

600
DRAM INITIALIZATION COMMAND 602
PHYSICAL BANK ADDRESS 604
FILL VALUE 606
607
DRAM MEMORY CTLR 112
32 BYTES
FILL VALUE MEMORY 130
group 0
group 1
group 2
group 3
group 124
group 125
group 126
group 127
32 BYTES
SENSE AMP LATCHES 134
32 BYTES
DRAM CELL ARRAY 140
1 PAGE = 32768 BITS
BITS

SYSTEMS AND METHODS FOR REDUCING MEMORY POWER CONSUMPTION VIA PRE-FILLED DRAM VALUES

DESCRIPTION OF THE RELATED ART

Portable computing devices (e.g., cellular telephones, smart phones, tablet computers, portable digital assistants (PDAs), portable game consoles, wearable devices, and other battery-powered devices) and other computing devices continue to offer an ever-expanding array of features and services, and provide users with unprecedented levels of access to information, resources, and communications. To keep pace with these service enhancements, such devices have become more powerful and more complex. Portable computing devices now commonly include a system on chip (SoC) comprising a plurality of memory clients embedded on a single substrate (e.g., one or more central processing units (CPUs), a graphics processing unit (GPU), digital signal processors (DSPs), etc.). The memory clients may read data from and store data in an external system memory (i.e., random access memory (RAM)) electrically coupled to the SoC via a high-speed bus.

Programs running on the processing devices (e.g., software applications, application frameworks, services, etc.) often rely on an initialization value for allocated RAM memory. The programs may request that a portion of RAM is to be filled with a constant value, such as all zeros. The programs may use an explicit assignment or copy and/or write operations. Conventional methods for performing RAM initialization suffer from various disadvantages. The CPU or processor must execute code to perform the RAM initialization, which contributes to CPU power consumption. To perform the initialization, a program may issue multiple write transactions via the SoC bus and the RAM memory controller to fill the RAM with the constant values. This can result in substantial traffic on these paths when the size of the portion to fill is relatively large, which may be encountered when zero initializing a display frame buffer or camera frame buffer. The traffic flowing through the SoC bus and the RAM bus may significantly contribute to memory power consumption. Furthermore, during the fill, other clients (e.g., GPU, DSPs, etc.) must share the RAM bus and may be stalled while the flooding occurs, creating system quality of service (QoS) and stability issues. These problems associated with RAM initialization may be exacerbated as demands for RAM capacity continue to increase.

Accordingly, there is a need for improved systems and methods for initializing RAM while reducing power consumption and maintaining performance and with minimal involvement of the processor, bus, and interfaces.

SUMMARY OF THE DISCLOSURE

Systems and methods are disclosed for reducing memory power consumption via pre-filled dynamic random access memory (DRAM) values. One embodiment is a method for setting DRAM values. A fill request is received from an executing program to fill an allocated portion of the DRAM with a predetermined pattern of values. The predetermined pattern of values is stored in a fill value memory residing in the DRAM. A fill command is sent to the DRAM. In response to the fill command, a plurality of sense amp latches are connected to the fill value memory to update the corresponding sense amp latch bits with the predetermined pattern of values stored in the fill value memory.

Another embodiment is a system comprising a system on chip (SoC) and DRAM. The SoC comprises a processing device and a memory controller. The DRAM is electrically coupled to the memory controller via a bus. The DRAM comprises a fill value memory and a plurality of sense amp latches. The fill value memory is used to pre-fill a predetermined pattern of values for an allocated portion of a memory cell array. The plurality of sense amp latches are electrically coupled to the fill value memory for updating corresponding sense amp latch bits with the predetermined pattern of values in response to a fill command received from the memory controller.

BRIEF DESCRIPTION OF THE DRAWINGS

In the Figures, like reference numerals refer to like parts throughout the various views unless otherwise indicated. For reference numerals with letter character designations such as "102A" or "102B", the letter character designations may differentiate two like parts or elements present in the same Figure. Letter character designations for reference numerals may be omitted when it is intended that a reference numeral to encompass all parts having the same reference numeral in all Figures.

DETAILED DESCRIPTION

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

In this description, the terms "communication device," "wireless device," "wireless telephone", "wireless communication device," and "wireless handset" are used interchangeably. With the advent of third generation ("3G") wireless technology and four generation ("4G"), greater bandwidth availability has enabled more portable computing devices with a greater variety of wireless capabilities. Therefore, a portable computing device may include a cellular telephone, a pager, a PDA, a smartphone, a navigation device, or a hand-held computer with a wireless connection or link.

Figure 1:
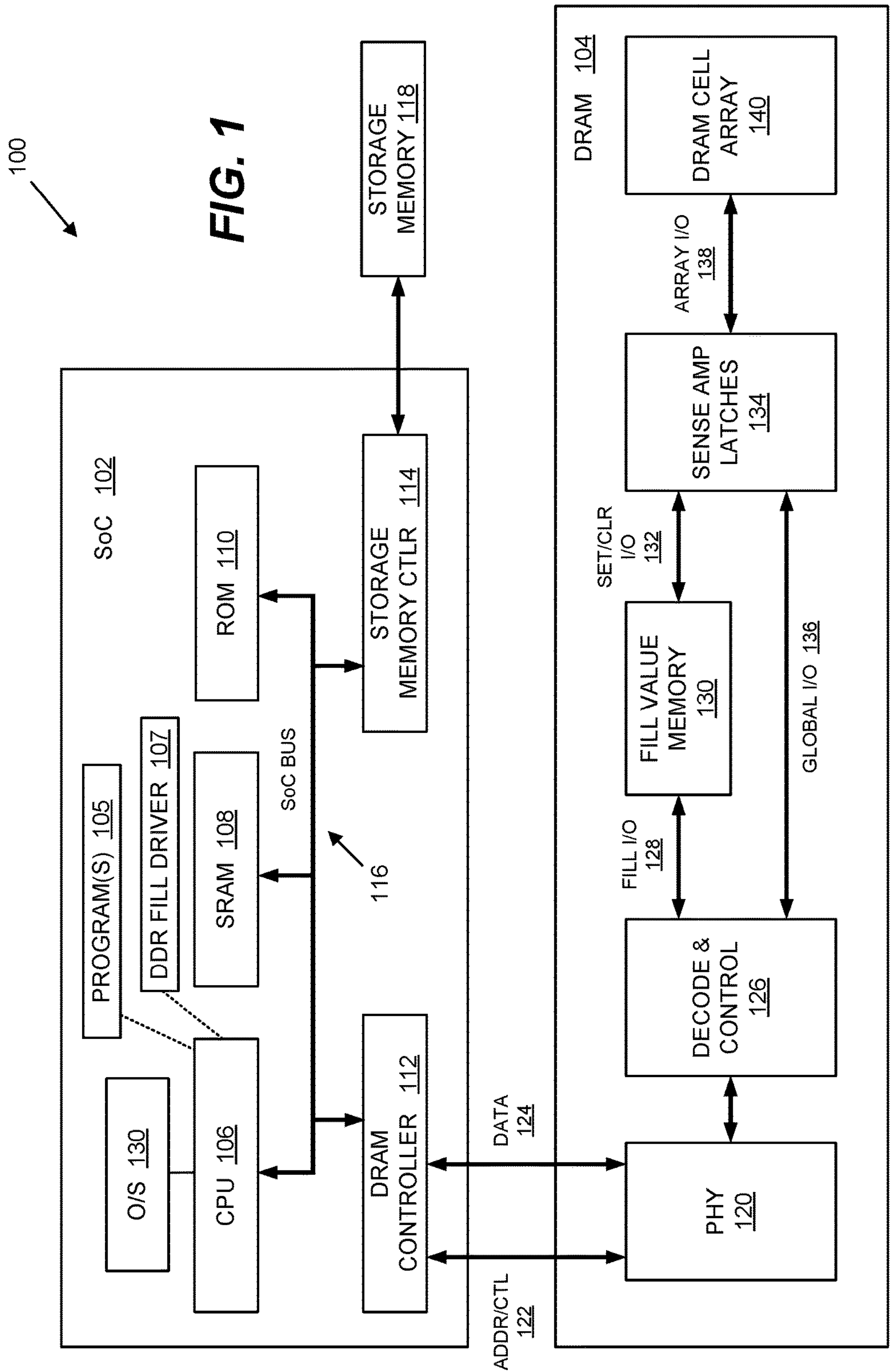
FIG. 1 is a block diagram of an embodiment of a system for reducing memory power consumption via pre-filled DRAM values.

FIG. 1 illustrates an embodiment of a system 100 for reducing memory power consumption via pre-filled RAM values. It should be appreciated that the pre-filling of RAM values may comprise initialization values or other RAM values or settings. It should be appreciated that system 100 may be implemented in any computing device, including a personal computer, a workstation, a server, a portable computing device (PCD), such as a cellular telephone, a smartphone, a portable digital assistant (PDA), a portable game console, a navigation device, a tablet computer, a wearable device, such as a sports watch, a fitness tracking device, etc., or other battery-powered, web-enabled devices. As illustrated in FIG. 1, the system 100 comprises a system on chip (SoC) 102 electrically coupled to a random access memory (RAM) via a memory bus. It should be appreciated that system 100 may incorporate various types of RAM memory devices. In the embodiment illustrated in FIG. 1, the SoC 102 is electrically coupled to a dynamic random access memory (DRAM) 104 via a DRAM bus.

The SoC 102 comprises various on-chip components, including a central processing unit (CPU) 106, a static random access memory (SRAM) 108, read only memory (ROM) 110, a DRAM controller 112, and a storage memory controller 114 electrically coupled via SoC bus 116. The CPU 106 may support a high-level operating system (O/S) 130. DRAM controller 112 controls communication with DRAM 104 via a high-speed bus comprising address/control bus 122 and data bus 124. The SoC 102 may be electrically coupled to external storage memory 118. Storage memory controller 114 controls communication with storage memory 118.

As known in the art, program(s) 105 executing on CPU 106 may rely on initialization values or other setting values for allocated RAM memory. The programs 105 requesting RAM settings (e.g., initialization) may comprise hardware, software, or firmware applications, application frameworks, services, etc. In an embodiment, a program 105 may request that a portion of DRAM 104 is to be initially filled with a constant value. For example, a display frame buffer, a camera frame buffer, or any other program 105 may request zero-initialization of allocated DRAM in which the memory is to be filled with all zeros. It should be appreciated, however, that DRAM initialization may involve filling DRAM 104 with any constant value (0 or 1) or any predetermined pattern of values.

As further illustrated in FIG. 1, a physical layer 120 in DRAM 104 receives memory transactions from DRAM controller 112. Physical layer 120 is electrically coupled to decode/control logic 126, which is configured to decode the data received via address/control bus 122 and data bus 124. Decode/control logic 126 is electrically coupled to a plurality of sense amp latches 134 via two control paths. A first control path comprises a global I/O interface 136 to the sense amp latches 136, which is used for performing write transactions. A second control path comprises a fill I/O interface 128 to a fill value memory 130, which is electrically coupled to the sense amp latches 134 via a set/clear I/O interface 132.

When performing a write to a DRAM cell array 140, write transactions result in data being written to the sense amp latches 134 via global I/O interface 136. As known in the art, sense amp latches 134 may store an entire page of data (e.g., 32768 bits). As known in the art, a write transaction comprising, for example, 256 bits, may only update a portion of a page. DRAM cell array 140 may be organized as multiple pages (e.g., 16536). Pages are "opened" by reading an entire page from DRAM cell array 140 into the sense amp latches 134. Pages are "closed" by storing an entire page from the sense amp latches 134 back into the DRAM cell array 140. In this manner, read or write transactions to update the data in the sense amp latches 134 may only occur when a page is "open".

It should be appreciated that the second control path (i.e., fill I/O interface 128 to fill value memory 130 and set/clear I/O interface 132 to sense amp latches 134) enables system 100 to reduce memory power consumption during DRAM initialization of large or numerous data structures, such as, constants, variables, arrays, strings, etc. When program(s) 105 running on CPU 106 request a portion of DRAM 104 to be filled with constant values or a predetermined pattern of values, the CPU 106 may first load the initialization values into fill value memory 130 via fill I/O interface 128. In an embodiment, the size of the fill value memory 130 may be equal to the size of a page (e.g., 32768 bits), although the fill values may comprise, for example, a smaller number of bits (e.g., 256 bits) of repeating unique constant values. The pre-filling of the fill value memory 130 with the fill values may involve a single write transaction. The pre-filling write transaction may occur, for example, once at system boot, or may be dynamically performed as program 105 is being executed.

When DRAM values are to be initialized, the system 100 may instruct fill value memory 130 and sense amp latches 134 to use the pre-filled initialization values to update a page that currently resides in the sense amp latches 134. As described below in more detail, in an embodiment, a fill command 502 (FIG. 5) may be generated and sent by the DRAM controller 112 to DRAM 104. The fill command 502 may be decoded by decode/control logic 126 into appropriate commands or signals that instruct the fill value memory 130 and sense amp latches 134 to use the content of the fill value memory 130 to update the page currently residing in sense amp latches 134. It should be appreciated that a portion or all of the page may be updated in accordance with the fill values. In an embodiment, the fill command 502 may be used to fill an entire page (e.g., 32768 bits) using a single fill command 502 and without transferring any data over SoC bus 116 to the DRAM bus (except when initializing the fill values), which may result in faster filling of the page and with reduced power consumption. It should be further appreciated that the 256-bit unique fill value constants can be any value, allowing flexibility in filling a page.

Figure 2:
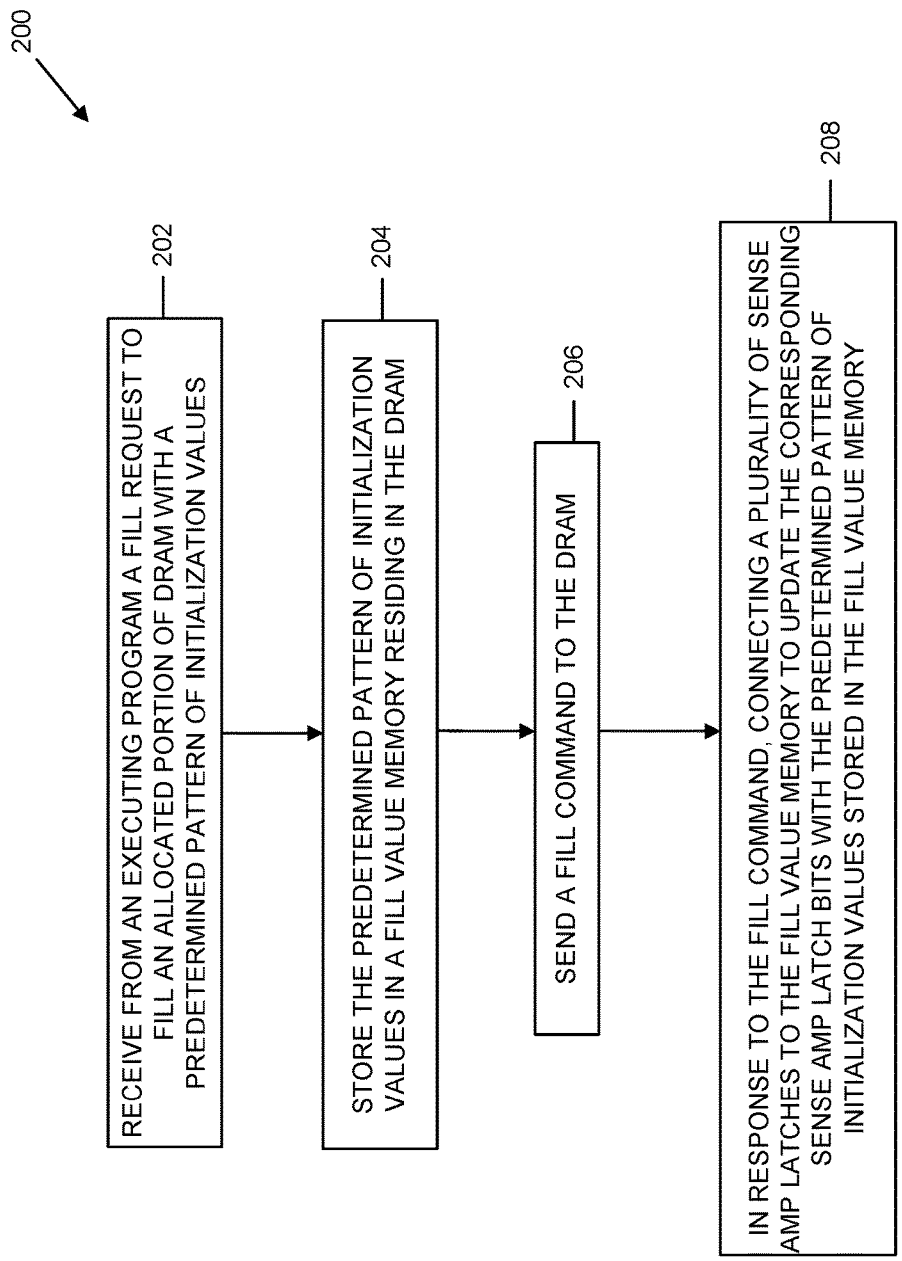
FIG. 2 is a flowchart illustrating an embodiment of a method for reducing memory power consumption in the system of FIG. 1 by pre-filling DRAM values.

FIG. 2 illustrates an embodiment of a method 200 implemented in system 100 for reducing memory power consumption during DRAM value initialization. At block 202, an executing program 105 may initiate a fill request to fill an allocated portion of DRAM 104 with a predetermined pattern of initialization values. The fill request may be received and/or processed by one or more of O/S 130, double data rate (DDR) driver 107, and DRAM controller 112. At block 204, the predetermined pattern of initialization values may be pre-filled by storing them in fill value memory 130 residing in DRAM 104. The pre-filling may occur at system boot or during program execution. At block 206, a fill command 502 may be generated and received by DRAM 104. In response to fill command 502, at block 208, a plurality of sense amp latches 134 may be connected to fill value memory 130 to update the corresponding sense amp latch bits with the predetermined pattern of initialization values stored in fill value memory 130.

Figure 3:
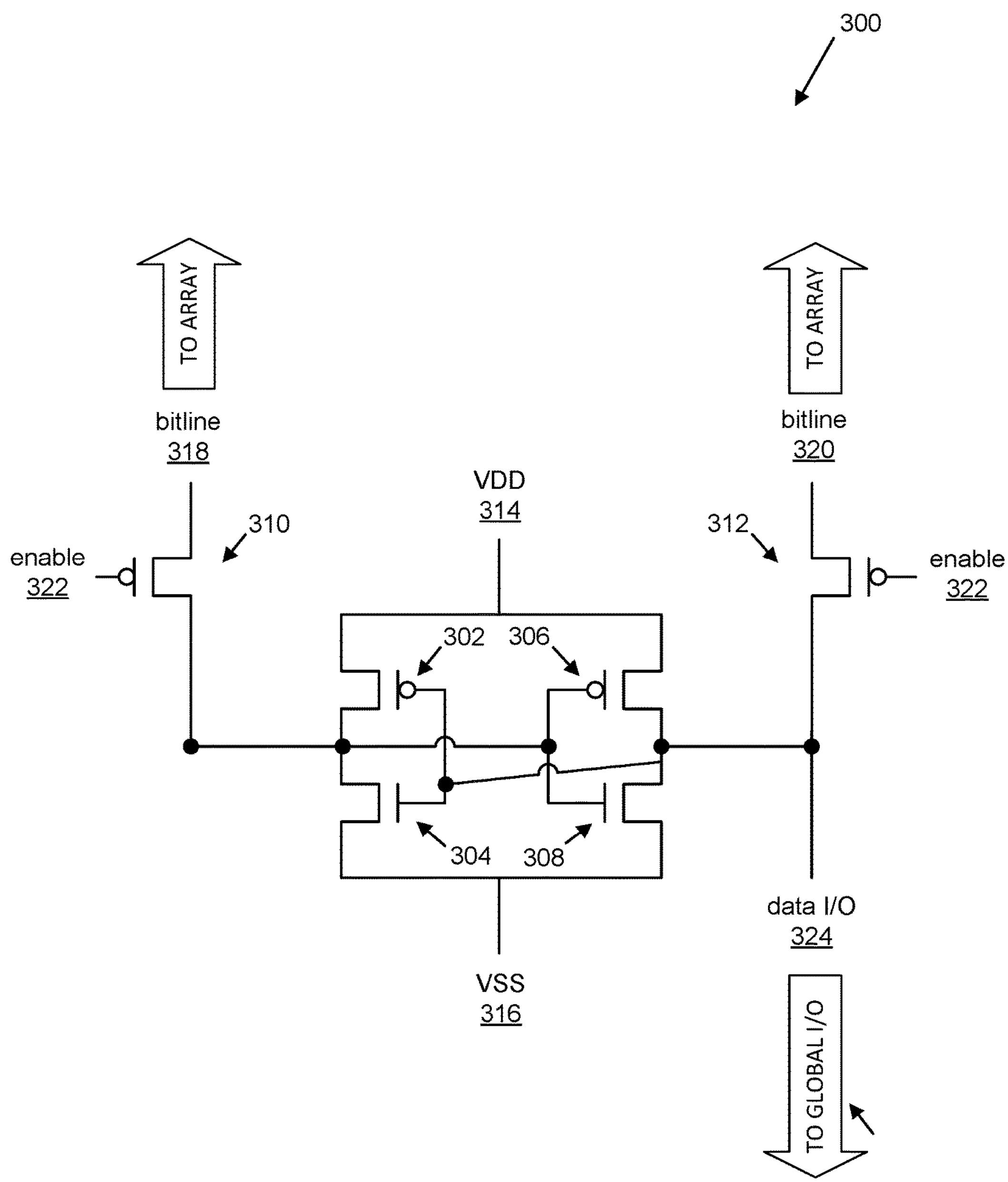
FIG. 3 is a circuit diagram illustrating a prior art sense amp latch structure.
Figure 4:
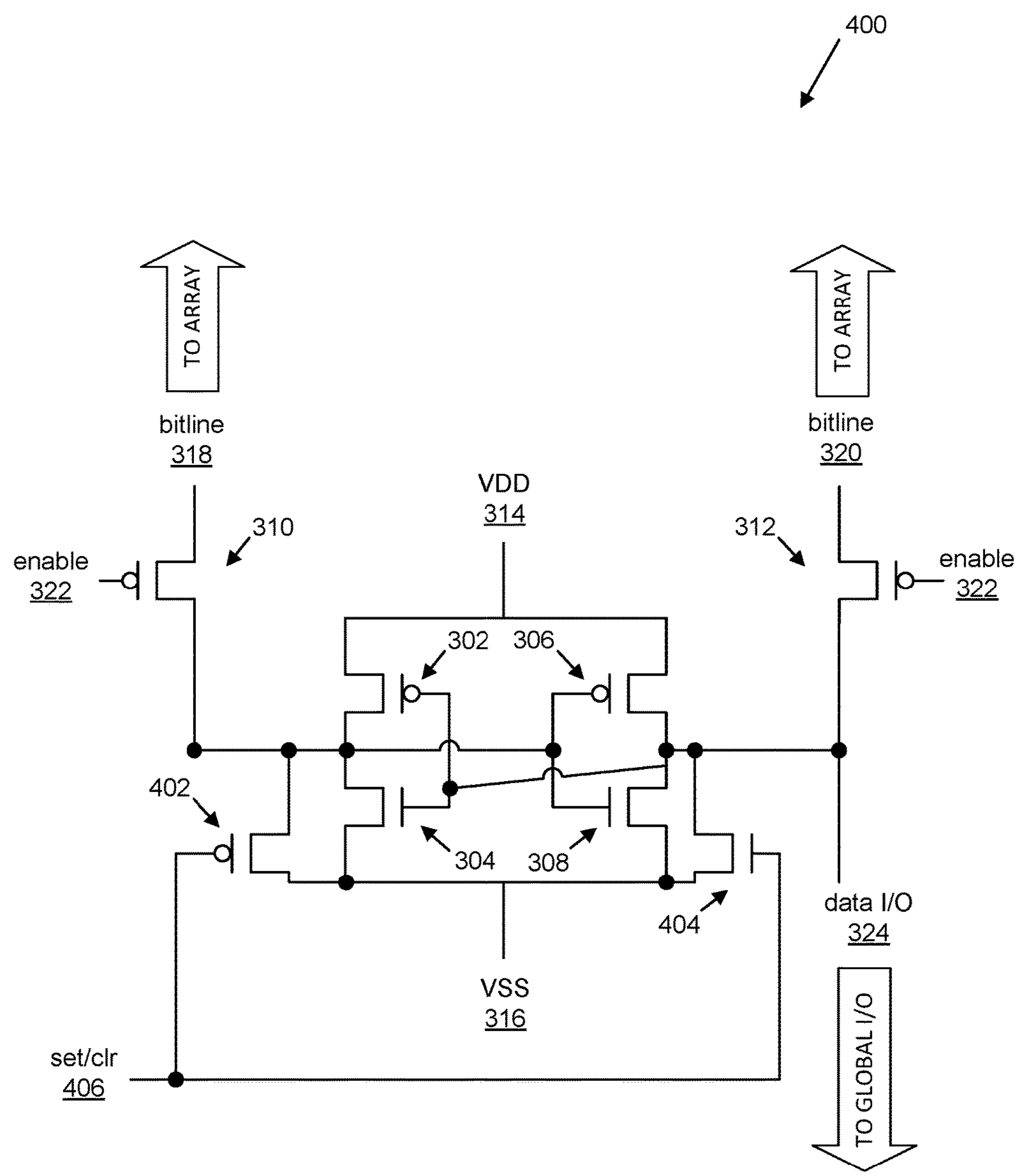
FIG. 4 is a circuit diagram illustrating an embodiment of a sense amp latch structure that may be incorporated in the DRAM of FIG. 1 for pre-filling DRAM values.

As mentioned above, when DRAM values are to be initialized, the system 100 instructs fill value memory 130 and sense amp latches 134 to use the pre-filled initialization values to update a page that currently resides in the sense amp latches 134. FIG. 3 illustrates a conventional circuit diagram of a sense amp latch for implementing a single bit within a page. FIG. 4 illustrates an improved circuit diagram for providing DRAM initialization as described above. Referring to FIG. 3, a conventional circuit comprises n-channel field effect transistors (nFETs) 304 and 308, and p-channel field effect transistors (pFETs) 302, 306, 310, and 312, which are electrically connected to bitlines 318 and 320, a positive supply voltage (VDD) 314, and a negative supply voltage (VSS) 316. Bitlines 318 and 320 are electrically coupled to an array I/O interface 138 to DRAM cell array 140. A data I/O interface 324 is electrically coupled to the global I/O interface 136. In operation, an enable signal 322 is provided to transistors 310 and 312 whenever opening or closing the page, which allows the value of the sense amp latch bit to connect (up) to/from DRAM cell array 140 via array I/O interface 138. Data I/O interface 324 connects the global I/O interface 136 externally to decode/control logic 126 (commonly referred to as peripheral circuitry). Each sense amp latch bit stores a value for one bit in the page. The value may be updated whenever opening a page or writing to the bit during a write transaction. The value can be read at any time.

FIG. 4 shows a modification to the conventional circuit diagram to support the DRAM initialization provided by system 100. The exemplary modified circuit diagram further comprises a pFET 402 and an nFET 404 that may be driven by a set/clear_not signal 406 provided on set/clr I/O interface 132 to allow the fill value memory 130 to update the value of the sense amp latch bit. In response to the set/clear_not signal 406, the sense amp latch bit is electrically coupled to the corresponding value stored in the fill value memory 130. In this manner, each of the sense amp latch bits within a page (e.g., 32,768 bits) may be simultaneously updated. It should be appreciated that the exemplary circuit diagram of FIG. 4 is merely one possible implementation. Other circuit diagrams may be implemented, and the specific combination and quantity of field effect transistor (FET) types and/or bipolar transistors is not restricted to this example. Furthermore, in other embodiments, an input multiplexer may be used, such as on the data I/O interface 324 (not shown), where a 2-input multiplexer may replace transistors 402 and 404 by using set/clear_not signal 406 to drive either a 1 or 0 onto the data I/O interface 324.

Figure 5:
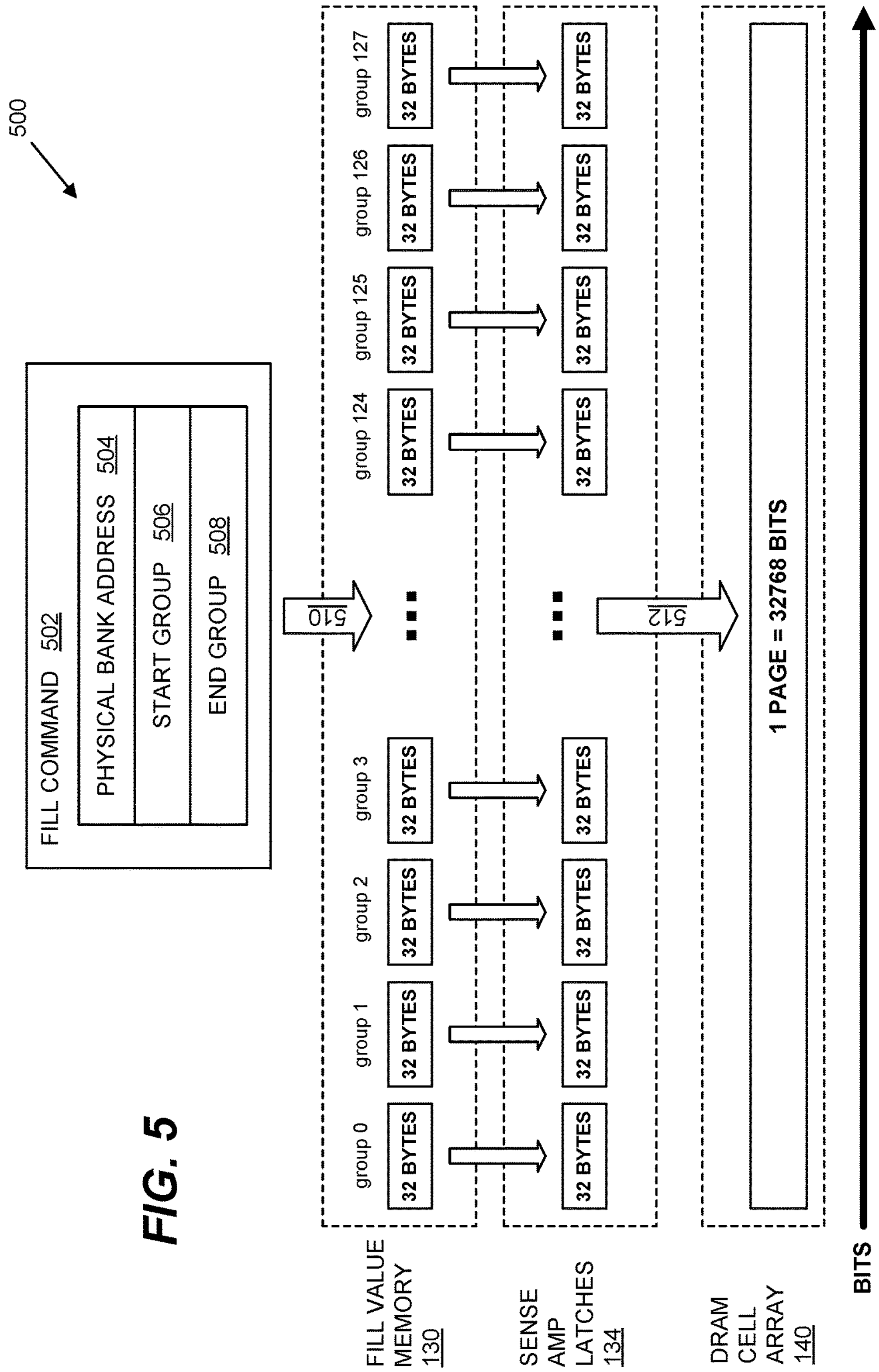
FIG. 5 is a flow/block diagram illustrating the data structure and operation of an embodiment of a memory fill command for initializing the sense amp latch bits with the values stored in the fill value memory.

FIG. 5 is a flow/block diagram illustrating the data structure and operation of an embodiment of a memory fill command 502 for updating the sense amp latch bits with the values stored in the fill value memory 130. When a fill is initiated, the fill command 502 may be generated and sent by DRAM controller 112. In the embodiment of FIG. 5, memory fill command 502 may include a physical bank address 504, a start group 506, and an end group 508. As known in the art, DRAM 104 may comprise one or more DRAM chips with each chip having a plurality of banks (e.g., 8 banks per DRAM chip). The physical bank address 504 may direct the fill operation to one of the physical banks. Each page may comprise 32,768 bits. Start group 506 and end group 508 may specify a contiguous portion of the page that will be filled using the fill values contained in the fill value memory 130. As illustrated in FIG. 5, the page may be organized into a plurality of groups (e.g., 128 groups where each group comprises 32 bytes). In one exemplary implementation, if start group 506 specifies group 0 and end group 508 specifies group 127, then the entire page will be filled from fill value memory 130. In other example, if start group 506 specifies group 126 and end group 508 specifies group 127, then only the upper 512 bits (64 bytes) of the page will be filled, and the lower 32256 bits (4032 bytes) of the page will remain untouched. In this regard, arrow 510 demonstrates that the fill command 502 controls which groups are to be filled. Arrow 512 illustrates the data transfer from the sense amp latches 134 to DRAM cell array 140. When "closing" a page, all sense amp latch data is transferred back to DRAM cell array 140. When "opening" a page, the opposite occurs (i.e., the sense amp latch data is filled with the content from DRAM cell array 140).

Figure 6:
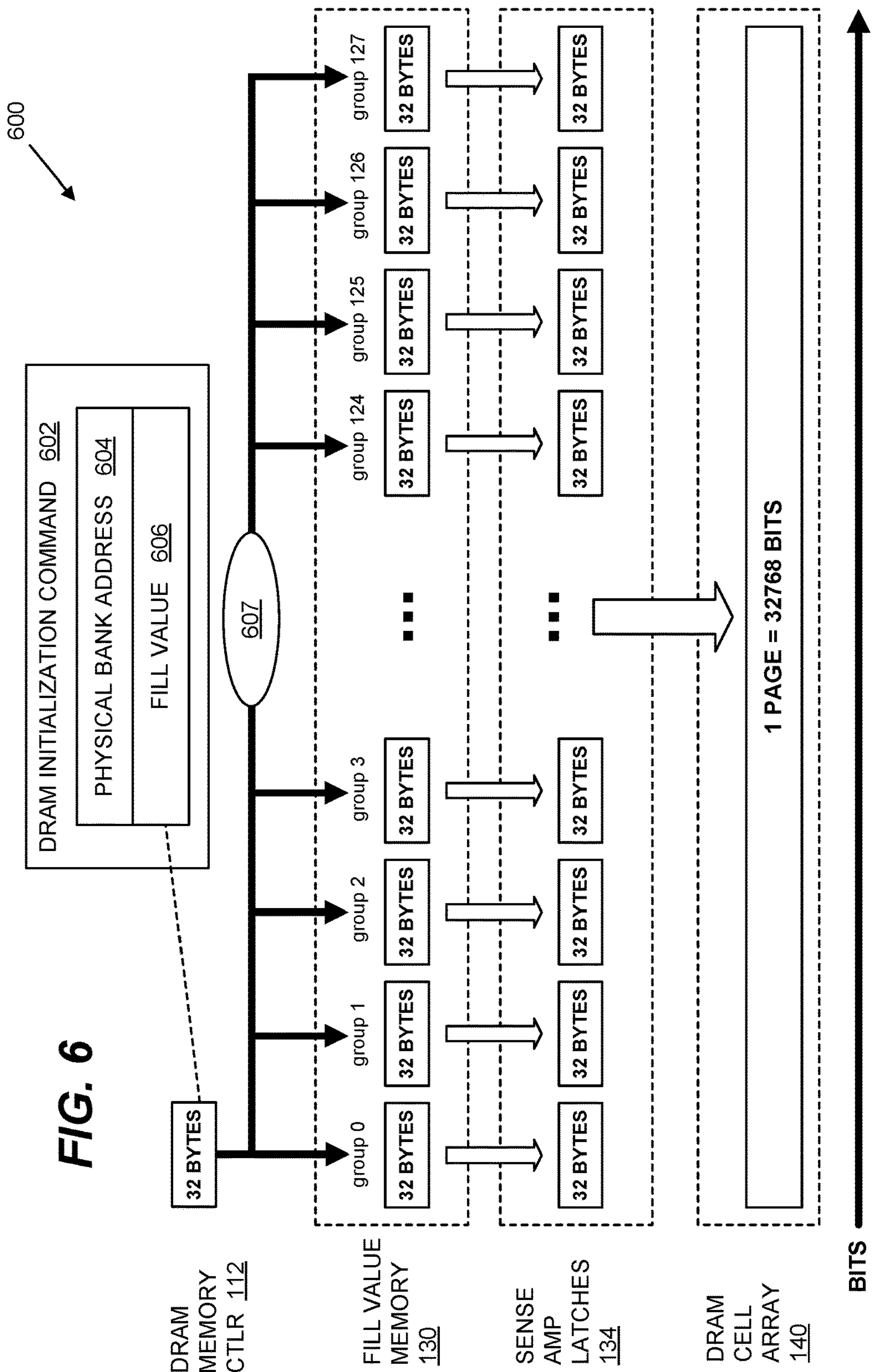
FIG. 6 is a flow/block diagram illustrating the data structure and operation of an embodiment of a DRAM initialization command for initializing the values stored in the fill value memory.

FIG. 6 is a flow/block diagram illustrating the data structure and operation of an embodiment of a DRAM initialization command 602 for initializing the fill values stored in the fill value memory 130. Prior to the fill command 502 being used, the fill value memory 130 may be initialized. The DRAM controller 112 may configure and send DRAM initialization command 602 to DRAM 104. In an embodiment, DRAM initialization command 602 comprises a physical bank address 604 and a fill value 606. It should be appreciated that the 32-byte fill value 606 may comprise any unique value. Following the above example from FIG. 5, as illustrated by reference numeral 607, the fill value 606 may comprise a 256-bit or 32-byte value used to initialize each of the 128 32-byte groups in the 4K byte fill value memory 130 specified by physical bank address 604 to the same value. For example, bit 0 of the 32-byte fill value may be written to bit 0 of group 0, to bit 0 of group 1, to bit 0 of group 2, and so forth. It should be appreciated that, in other embodiments, instead of having a unique fill value and fill value memory 130 for each bank, there can be a single fill value memory 130 that serves all banks in the same memory chip. It should be appreciated that, in other embodiments, instead of repeating the 32-byte fill value across each of the 128 groups, there can be an additional parameter in DRAM initialization command 602, which selectively applies the 32-byte fill value to a subset of the 128 groups, allowing greater flexibility when filling the fill value memory 130. In further embodiments, the choice of 32-bytes as the unit for transacting fill values and groups can be adjusted larger or smaller in size where necessary.

Figure 7:
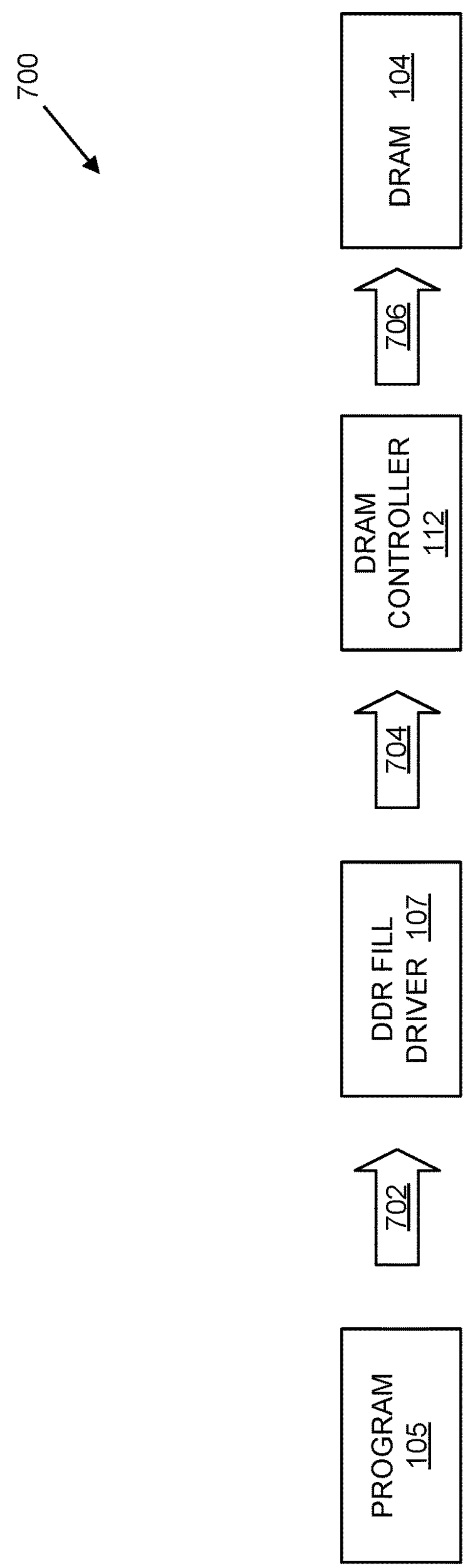
FIG. 7 is a flow/block diagram illustrating an embodiment of the DDR fill driver for pre-filling DRAM values in the system of FIG. 1.

FIG. 7 illustrates an exemplary control flow in system 100 for implementing DRAM initialization. The DDR fill driver 107 may provide a software interface between the executing program(s) 105 and DRAM controller 112. Program 105 may initiate DRAM initialization by making a call (reference numeral 702) to DDR fill driver 1000. DDR fill driver 107 may translate the program's fill request into parameters that will instruct the DRAM controller 112 (reference numeral 704) to execute the fill command 502 on DRAM 104 (reference numeral 706).

Figure 8:
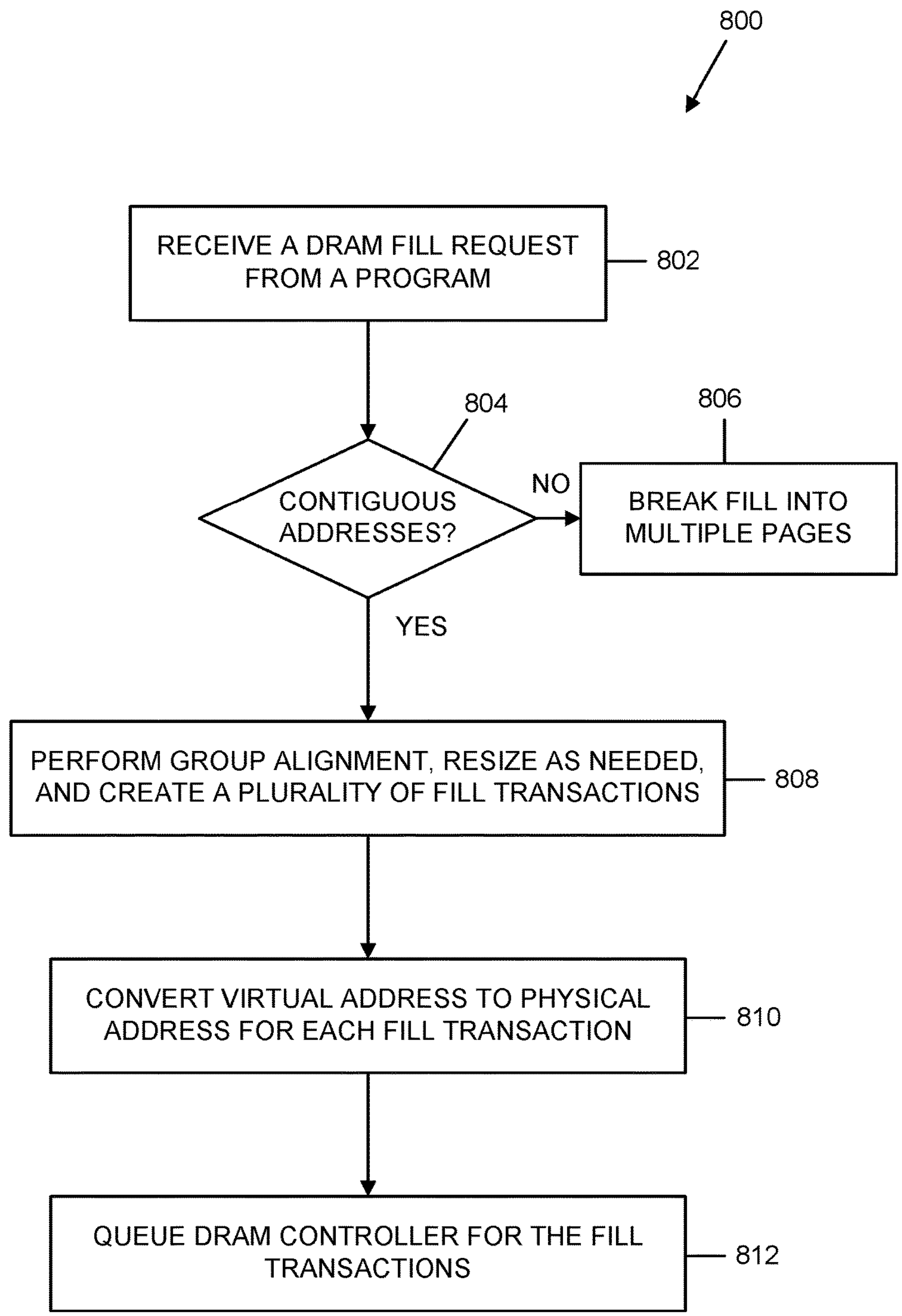
FIG. 8 is a flowchart illustrating the architecture, operation, and/or functionality of an embodiment of the DDR fill driver in FIG. 7.

FIG. 8 is a flowchart illustrating the architecture, operation, and/or functionality of an embodiment of the DDR fill driver 107. At block 802, the DDR fill driver 107 may receive a fill request from a program executed by the CPU 106 on SoC 102. At decision block 804, the DDR fill driver 107 may check to determine if the fill request is for contiguous addresses. If "no", at block 806, the DDR fill driver 107 may break the fill request into multiple pages. If "yes", at block 808, the DDR fill driver 107 may perform group alignment, resize as needed, and generate a plurality of fill transactions. At block 810, DDR fill driver 107 may convert virtual addresses to physical addresses for each fill transaction. At block 812, the DDR fill driver 107 may queue DRAM controller 112 for the fill transactions. The queuing operation may include the opening/closing of new pages (e.g., if the original request spans multiple pages).

Figure 9:
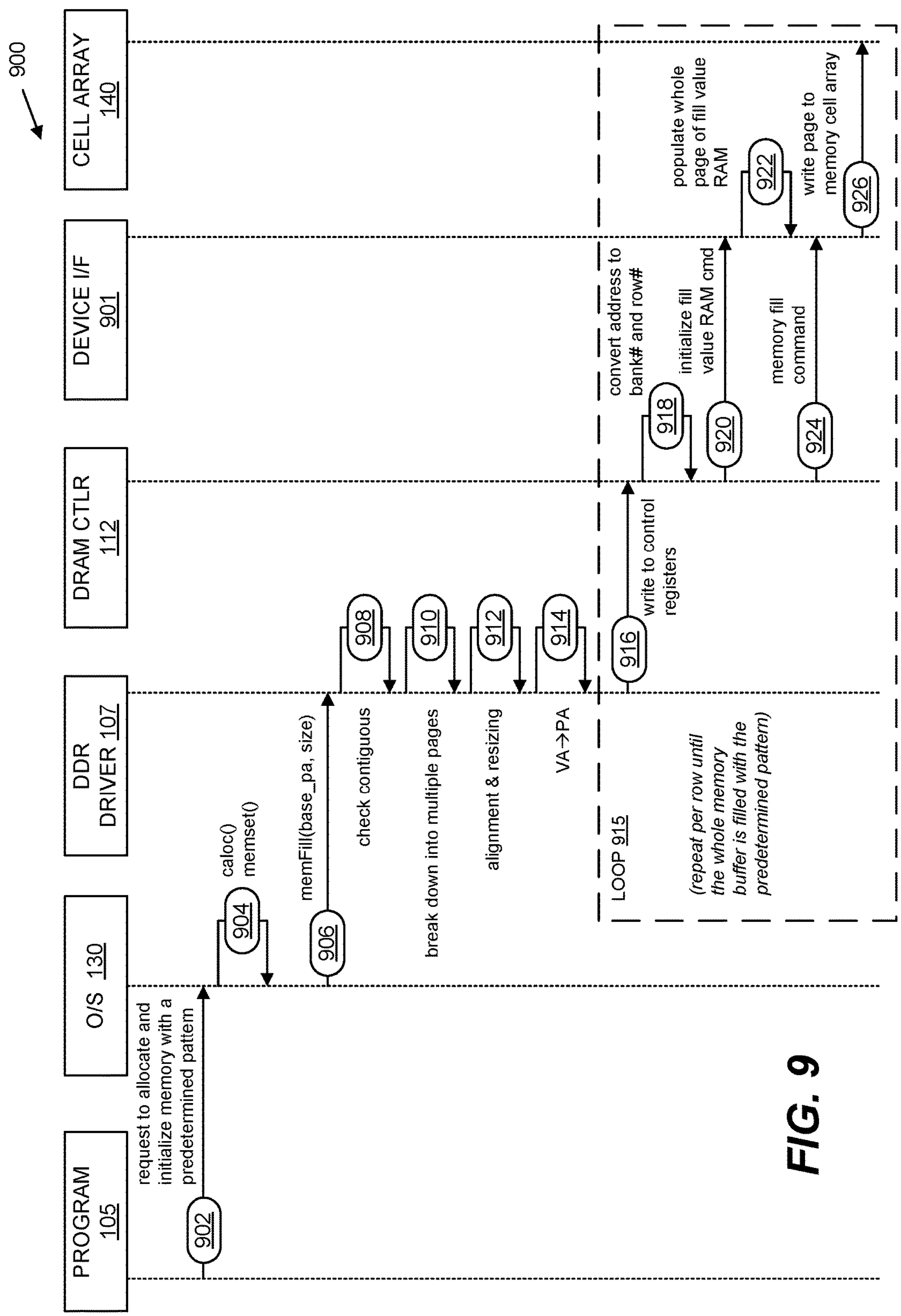
FIG. 9 is a flow/block diagram illustrating an embodiment of a method implemented in the system of FIG. 1.

FIG. 9 is a flow/block diagram illustrating another embodiment of a method 900 implemented in the system 100 for reducing memory power consumption by pre-filling DRAM values. The method 900 illustrates the flow between program(s) 105 initiating a fill request, O/S 130, DDR fill driver 107, DRAM controller 112, a device interface 901, and cell array 140. It should be appreciated that, for purposes of simplifying the flow diagram, the device interface 901 may comprise a combination of one or more of the following: PHY 120, decode and control module 126, fill value memory 130, and sense amp latches 134. The initial conditions may assume that an activation has previously occurred and that the sense amp latches 134 currently hold a valid page to be subsequently filled as described herein. At reference numeral 902, program 105 may send a request to the O/S 130 to allocate a portion of DRAM memory to be initialized with a predetermined pattern of values. At reference numeral 904, O/S 130 may respond by allocating memory with a requested size, and initialize the memory by using O/S function(s), such as, for example, a calloc( ) or memset( ) function. At reference numeral 904, O/S 130 may initiate a call to DDR fill driver 107. The call may comprise a memFill( ) function, which specifies a base physical address and a size. As mentioned above in connection with FIG. 8, in response to the call, the DDR fill driver 107 may check for contiguous addresses (reference numeral 908), break down the request into multiple pages (reference numeral 910), perform group alignment and resizing (reference numeral 912), and perform virtual-to-physical address translation (reference numeral 914). As illustrated in FIG. 9, the DDR fill driver 107 may initiate a control loop 915 which may be repeated for each row until the whole memory buffer is filled with the predetermined pattern.

At reference numeral 916, the DDR fill driver 107 may write to control registers. At reference numeral 918, DRAM controller 112 may convert addresses to a bank number and a row number. At reference numeral 920, DRAM controller 112 may initiate the DRAM initialization command 602 to device interface xxx. At reference numeral 922, the fill value memory 130 may be pre-filled with the unique fill value 606. At reference numeral 924, DRAM controller 112 may initiate a fill command 502 to device interface xxx. At reference numeral 926, the page may be written to memory cell array 140 with the pre-filled values.

As mentioned above, the fill command 502 may specify that only a portion or all of page is to be updated in accordance with pre-filled values stored in fill value memory 130. In this regard, it should be appreciated that, in another embodiment, a first control loop 915 may be used to fill a first portion of allocated DRAM, while one or more further control loops 915 may be used to fill additional portions. In one example, a first control loop 915 fills a first portion with a first pattern of values, and a second control fills a second portion with a second pattern of values.

One of ordinary skill in the art will appreciate that the systems and methods described above may be leveraged for use in performing an enhanced page copy operation. O/S 130 may employ a copy-on-write (COW) mechanism whereby multiple processes can reference a 4 KB page as read-only up until the time that they need to modify the content of the page. When the need for modification arises, O/S 130 may create a copy of the original page and permit write access to the process. At this point, there will be two pages: (1) the original page which has write access from the original process; and (2) the copied page which has write access from the new process. COW is desirable in modern system because it is economical on memory space (i.e., copies are only created when a process needs to modify the original reference). The traditional method for copying one page to another is memcpy( ) which simply copies N bytes from source address to destination address. This may consume more energy than a traditional memory fill because this operation may use both reads and writes and is generally done with N=64 or 128 bytes at a time (i.e, read, write, read, write, etc.). For a full page COW, this amounts to 4 KB of copy. As described above, the convention method involves the CPU, the interconnect, and the DDR bus, which all contribute to power consumption.

Using the above-described methods and systems, there may be page copies of certain types of COW pages (e.g., zero-filled arrays, image and surface buffers, etc.), where during COW, a modified memcpy( ) may read M=4096 bytes from the source address while leveraging the DDR fill driver 107 and the sense amp latch structure to complete the fill (copy). O/S 130 may already be aware of the 4K page contents. For example, there may be a Z flag set, which indicates all zeros. Alternatively, during the read phase, DRAM controller 112 may detect if the copy operation can benefit from pre-filling. IN this regard, the DRAM controller 112 may support hardware monitoring, which performs in-flight comparison of the read data, looks for zero and/or repeating values, and provides software readable status on the outcome. For example, the hardware checks if all or a portion of the 4K bytes of read data are equal to the first byte. Another implementation may only check for all zero values. Further checking may determine if a meaningful portion (⅛, ¼, etc. but not 1/32) of the 4K byte page have identical values. In other embodiments, instead of read, write, read, write, a modified memcpy( ) using this technique may assign a portion of internal cache RAM or other SRAM 108 to use as a temporary buffer to read the entire 4K bytes of read data. Upon completion of the 4K byte read, the status of the DRAM controller 112 hardware status may be checked, and the above-described methods and systems may be initiated to perform the 4K byte write if the opportunity to save energy presents itself (e.g., if the 4K bytes read were all zero values or all repeating values). If the status of the DRAM controller 112 hardware does not indicate an opportunity of zero or repeating values, then conventional 4K byte writes may complete the memcpy( ).

Memory accesses from various clients may be interleaved and discontiguous, so the hardware may be aware of the physical addresses when calculating the status. The hardware can also inspect a standard bus transaction master ID to whitelist clients (e.g., ignore all clients except for the CPU). The COW may use this information to determine whether the pre-filling will benefit the modified memcpy( ). If it can (e.g., the copied 4K are all zero), then pre-filling DRAM values may improve energy efficiency of the overall COW □operation. If it cannot (e.g., the copied 4K are random), then a conventional memcpy( ) may be employed.

Figure 10:
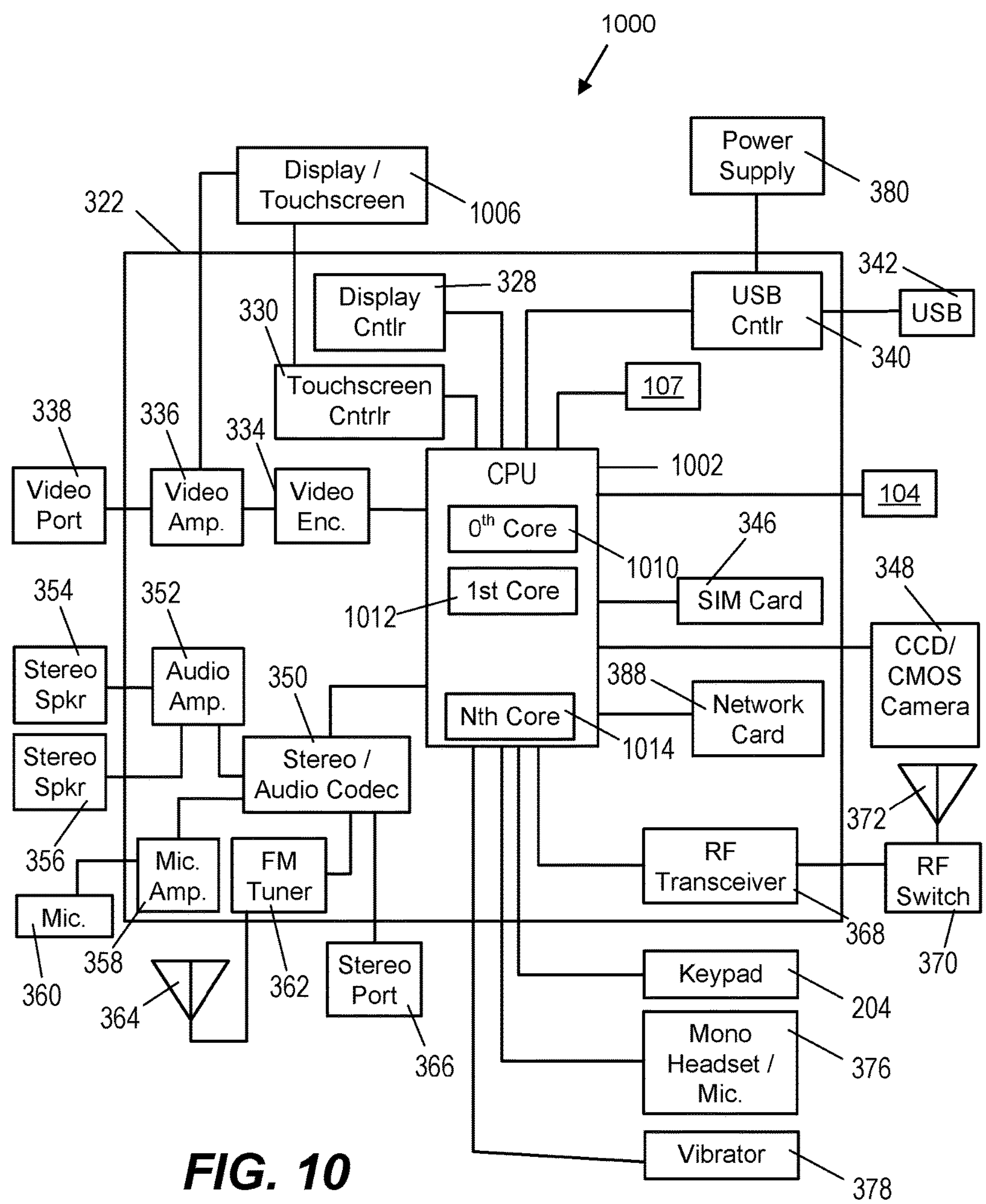
FIG. 10 is a block diagram of an embodiment of a portable computing device for incorporating the system of FIG. 1.

As mentioned above, the system 100 may be incorporated into any desirable computing system. FIG. 10 illustrates the system 100 incorporated in an exemplary portable computing device (PCD) 1000. It will be readily appreciated that certain components of the system 100 may be included on the SoC 322 (e.g., DDR fill driver 107, DRAM controller 112) while other components (e.g., DRAM 104) may be external components coupled to the SoC 322. The SoC 322 may include a multicore CPU 1002. The multicore CPU 1002 may include a zeroth core 1010, a first core 1012, and an Nth core 1014. One of the cores may comprise, for example, a graphics processing unit (GPU) with one or more of the others comprising the CPU.

A display controller 328 and a touch screen controller 330 may be coupled to the CPU 1002. In turn, the touch screen display 1006 external to the on-chip system 322 may be coupled to the display controller 328 and the touch screen controller 330.

FIG. 10 further shows that a video encoder 334, e.g., a phase alternating line (PAL) encoder, a sequential color a memoire (SECAM) encoder, or a national television system(s) committee (NTSC) encoder, is coupled to the multicore CPU 1002. Further, a video amplifier 336 is coupled to the video encoder 334 and the touch screen display 1006. Also, a video port 338 is coupled to the video amplifier 336. As shown in FIG. 10, a universal serial bus (USB) controller 340 is coupled to the multicore CPU 1002. Also, a USB port 342 is coupled to the USB controller 340.

Further, as shown in FIG. 10, a digital camera 348 may be coupled to the multicore CPU 1002. In an exemplary aspect, the digital camera 348 is a charge-coupled device (CCD) camera or a complementary metal-oxide semiconductor (CMOS) camera.

As further illustrated in FIG. 10, a stereo audio coder-decoder (CODEC) 350 may be coupled to the multicore CPU 1002. Moreover, an audio amplifier 352 may coupled to the stereo audio CODEC 350. In an exemplary aspect, a first stereo speaker 354 and a second stereo speaker 356 are coupled to the audio amplifier 352. FIG. 10 shows that a microphone amplifier 358 may be also coupled to the stereo audio CODEC 350. Additionally, a microphone 360 may be coupled to the microphone amplifier 358. In a particular aspect, a frequency modulation (FM) radio tuner 362 may be coupled to the stereo audio CODEC 350. Also, an FM antenna 364 is coupled to the FM radio tuner 362. Further, stereo headphones 366 may be coupled to the stereo audio CODEC 350.

FIG. 10 further illustrates that a radio frequency (RF) transceiver 368 may be coupled to the multicore CPU 1002. An RF switch 370 may be coupled to the RF transceiver 368 and an RF antenna 372. A keypad 204 may be coupled to the multicore CPU 1002. Also, a mono headset with a microphone 376 may be coupled to the multicore CPU 702. Further, a vibrator device 378 may be coupled to the multicore CPU 1002.

FIG. 10 also shows that a power supply 380 may be coupled to the on-chip system 322. In a particular aspect, the power supply 380 is a direct current (DC) power supply that provides power to the various components of the PCD 1000 that require power. Further, in a particular aspect, the power supply is a rechargeable DC battery or a DC power supply that is derived from an alternating current (AC) to DC transformer that is connected to an AC power source.

FIG. 10 further indicates that the PCD 1000 may also include a network card 388 that may be used to access a data network, e.g., a local area network, a personal area network, or any other network. The network card 388 may be a Bluetooth network card, a WiFi network card, a personal area network (PAN) card, a personal area network ultra-low-power technology (PeANUT) network card, a television/cable/satellite tuner, or any other network card well known in the art. Further, the network card 388 may be incorporated into a chip, i.e., the network card 388 may be a full solution in a chip, and may not be a separate network card 388.

As depicted in FIG. 10, the touch screen display 606, the video port 338, the USB port 342, the camera 348, the first stereo speaker 354, the second stereo speaker 356, the microphone 360, the FM antenna 364, the stereo headphones 366, the RF switch 370, the RF antenna 372, the keypad 374, the mono headset 376, the vibrator 378, and the power supply 380 may be external to the on-chip system 322.

It should be appreciated that one or more of the method steps described herein may be stored in the memory as computer program instructions, such as the modules described above. These instructions may be executed by any suitable processor in combination or in concert with the corresponding module to perform the methods described herein.

Certain steps in the processes or process flows described in this specification naturally precede others for the invention to function as described. However, the invention is not limited to the order of the steps described if such order or sequence does not alter the functionality of the invention. That is, it is recognized that some steps may performed before, after, or parallel (substantially simultaneously with) other steps without departing from the scope and spirit of the invention. In some instances, certain steps may be omitted or not performed without departing from the invention. Further, words such as “thereafter”, “then”, “next”, etc. are not intended to limit the order of the steps. These words are simply used to guide the reader through the description of the exemplary method.

Additionally, one of ordinary skill in programming is able to write computer code or identify appropriate hardware and/or circuits to implement the disclosed invention without difficulty based on the flow charts and associated description in this specification, for example.

Therefore, disclosure of a particular set of program code instructions or detailed hardware devices is not considered necessary for an adequate understanding of how to make and use the invention. The inventive functionality of the claimed computer implemented processes is explained in more detail in the above description and in conjunction with the Figures which may illustrate various process flows.

In one or more exemplary aspects, the functions described may be implemented in hardware, software, firmware, or any combination thereof. If implemented in software, the functions may be stored on or transmitted as one or more instructions or code on a computer-readable medium. Computer-readable media include both computer storage media and communication media including any medium that facilitates transfer of a computer program from one place to another. A storage media may be any available media that may be accessed by a computer. By way of example, and not limitation, such computer-readable media may comprise RAM, ROM, EEPROM, NAND flash, NOR flash, M-RAM, P-RAM, R-RAM, CD-ROM or other optical disk storage, magnetic disk storage or other magnetic storage devices, or any other medium that may be used to carry or store desired program code in the form of instructions or data structures and that may be accessed by a computer.

Also, any connection is properly termed a computer-readable medium. For example, if the software is transmitted from a website, server, or other remote source using a coaxial cable, fiber optic cable, twisted pair, digital subscriber line ("DSL"), or wireless technologies such as infrared, radio, and microwave, then the coaxial cable, fiber optic cable, twisted pair, DSL, or wireless technologies such as infrared, radio, and microwave are included in the definition of medium.

Disk and disc, as used herein, includes compact disc ("CD"), laser disc, optical disc, digital versatile disc ("DVD"), floppy disk and blu-ray disc where disks usually reproduce data magnetically, while discs reproduce data optically with lasers. Combinations of the above should also be included within the scope of computer-readable media.

Alternative embodiments will become apparent to one of ordinary skill in the art to which the invention pertains without departing from its spirit and scope. Therefore, although selected aspects have been illustrated and described in detail, it will be understood that various substitutions and alterations may be made therein without departing from the spirit and scope of the present invention, as defined by the following claims.

What is claimed is:

1. A method for setting values of a dynamic random access memory, the method comprising:

receiving from an executing program a fill request to fill an allocated portion of a dynamic random access memory with a predetermined pattern of values;

storing the predetermined pattern of values in a fill value memory residing in the DRAM;

sending a fill command to the DRAM; and in response to the fill command, connecting a plurality of sense amp latches to the fill value memory to update the corresponding sense amp latch bits with the predetermined pattern of values stored in the fill value memory.

2. The method of claim 1, wherein the storing the predetermined pattern of values in the fill value memory comprises a write transaction to the DRAM.

3. The method of claim 2, wherein the write transaction occurs during the executing program.

4. The method of claim 1, wherein the fill command comprises a physical bank address identifying one of a plurality of DRAM banks to be filled using the predetermined pattern of values stored in the fill value memory.

5. The method of claim 4, wherein the fill command further comprises a start group and an end group defining a contiguous portion of a page to be filled using the predetermined pattern of values stored in the fill value memory.

6. The method of claim 1, wherein the predetermined pattern of values comprises a programmable constant value.

7. The method of claim 1, wherein the connecting the plurality of sense amp latches to the fill value memory comprises sending a set/clear_not signal to the plurality of sense amp latches.

8. The method of claim 1, wherein the plurality of sense amp latches corresponds to a page.

9. The method of claim 8, further comprising: writing the page to a memory cell array.

10. A system for setting values of a dynamic random access memory, the system comprising:

means for receiving from an executing program a fill request to fill an allocated portion of a dynamic random access memory (DRAM) with a predetermined pattern of values;

means for storing the predetermined pattern of values in a fill value memory residing in the DRAM;

means for sending a fill command to the DRAM; and means for connecting, in response to the fill command, a plurality of sense amp latches to the fill value memory to update the corresponding sense amp latch bits with the predetermined pattern of values stored in the fill value memory.

11. The system of claim 10, wherein the means for storing the predetermined pattern of values in the fill value memory comprises:

means for performing a write transaction to the DRAM.

12. The system of claim 11, wherein the write transaction occurs during the executing program.

13. The system of claim 10, wherein the fill command comprises a physical bank address identifying one of a plurality of DRAM banks to be filled using the predetermined pattern of values stored in the fill value memory.

14. The system of claim 13, wherein the fill command further comprises a start group and an end group defining a contiguous portion of a page to be filled using the predetermined pattern of values stored in the fill value memory.

15. The system of claim 10, wherein the predetermined pattern of values comprises a constant value.

16. The system of claim 10, wherein the means for connecting the plurality of sense amp latches to the fill value memory comprises:

means for sending a set/clear_not signal to the plurality of sense amp latches.

17. The system of claim 10, wherein the plurality of sense amp latches corresponds to a page.

18. The system of claim 17, further comprising:

means for writing the page to a memory cell array.

19. A system for setting values of a dynamic random access memory, the system comprising:

a system on chip (SoC) comprising a processing device and a memory controller; and a dynamic random access memory (DRAM) electrically coupled to the memory controller via a bus, the DRAM comprising:

a fill value memory for pre-filling a predetermined pattern of values for an allocated portion of a memory cell array; and a plurality of sense amp latches electrically coupled to the fill value memory for updating corresponding sense amp latch bits with the predetermined pattern of values in response to a fill command received from the memory controller.

20. The system of claim 19, wherein the fill value memory is pre-filled with the predetermined pattern of values via a write transaction initiated by the memory controller.

21. The system of claim 20, wherein the write transaction occurs during execution of a program by the processing device that initiates a fill request to fill an allocated portion of the DRAM with the predetermined pattern of values.

22. The system of claim 19, wherein the fill command received from the memory controller comprises a physical bank address identifying one of a plurality of DRAM banks to be filled using the predetermined pattern of values stored in the fill value memory.

23. The system of claim 22, wherein the fill command further comprises a start group and an end group defining a contiguous portion of a page to be filled using the predetermined pattern of values stored in the fill value memory.

24. The system of claim 19, wherein the predetermined pattern of values comprises a constant value.

25. The system of claim 19, wherein the plurality of sense amp latch bits are updated with the predetermined pattern of values by sending a set/clear_not signal to the plurality of sense amp latches.

26. A computer program embodied in a computer-readable medium and executable by a processing device for setting values of a dynamic random access memory, the computer program comprising logic configured to:

receive from an executing program a fill request to fill an allocated portion of a dynamic random access memory (DRAM) with a predetermined pattern of values;

store the predetermined pattern of values in a fill value memory residing in the DRAM; and instruct a plurality of sense amp latches to update corresponding sense amp latch bits with the predetermined pattern of values stored in the fill value memory.

27. The computer program of claim 26, wherein the fill command comprises a physical bank address identifying one of a plurality of DRAM banks to be filled using the predetermined pattern of values stored in the fill value memory.

28. The computer program of claim 27, wherein the fill command further comprises a start group and an end group defining a contiguous portion of a page to be filled using the predetermined pattern of values stored in the fill value memory.

29. The computer program of claim 26, wherein the predetermined pattern of values comprises a constant value.

30. The computer program of claim 26, wherein the logic configured to instruct the plurality of sense amp latches to update the corresponding sense amp latch bits with the predetermined pattern of values stored in the fill value memory comprises logic configured to: send a set/clear_not signal to the plurality of sense amp latches.

* * * * *